(12) United States Patent
Chung et al.

(10) Patent No.: US 8,876,334 B2
(45) Date of Patent: *Nov. 4, 2014

(54) LIGHT-MIXING MULTICHIP PACKAGE STRUCTURE

(75) Inventors: Chia-Tin Chung, Miaoli County (TW); Shih-Neng Tai, Taoyuan County (TW)

(73) Assignee: Paragon Semiconductor Lighting Technology Co., Ltd., New Taipei (TW)

( * ) Notice: Subject to any disclaimer, the term of this patent is extended or adjusted under 35 U.S.C. 154(b) by 369 days.

This patent is subject to a terminal disclaimer.

(21) Appl. No.: 13/350,968

(22) Filed: Jan. 16, 2012

(65) Prior Publication Data

US 2013/0181601 A1    Jul. 18, 2013

(51) Int. Cl.
*F21V 29/00* (2006.01)
*H01L 23/34* (2006.01)

(52) U.S. Cl.
USPC . 362/294; 362/235; 362/311.02; 362/311.04; 257/98; 257/100; 257/712

(58) Field of Classification Search
CPC .......... H01L 2224/48091; H01L 2224/73265; H01L 2224/48227; H01L 2224/48247; H01L 2924/00; H01L 2924/00014; H01L 2924/12041; H01L 27/12; H01L 25/0753; H01L 33/62; H01L 33/08; H01L 33/60; H01L 33/486; H01L 33/502; H01L 33/405; H01L 25/167
See application file for complete search history.

(56) References Cited

U.S. PATENT DOCUMENTS

| | | | |
|---|---|---|---|
| 2009/0046456 A1* | 2/2009 | Urano et al. | 362/235 |
| 2010/0045790 A1* | 2/2010 | Lynam et al. | 348/140 |
| 2011/0096560 A1* | 4/2011 | Ryu et al. | 362/510 |
| 2011/0260646 A1* | 10/2011 | Moon et al. | 315/294 |
| 2012/0014110 A1* | 1/2012 | Sanpei et al. | 362/296.04 |
| 2012/0080674 A1* | 4/2012 | Shimizu et al. | 257/48 |
| 2012/0187865 A1* | 7/2012 | Chung et al. | 315/294 |
| 2012/0268929 A1* | 10/2012 | Chung et al. | 362/231 |
| 2013/0193462 A1* | 8/2013 | Ishizaki et al. | 257/88 |

* cited by examiner

*Primary Examiner* — Ashok Patel
(74) *Attorney, Agent, or Firm* — Li & Cai Intellectual Property (USA) Office

(57) ABSTRACT

A light-mixing multichip package structure includes a substrate unit, a light-emitting unit, a package unit, and a frame unit. The substrate unit includes a substrate body. The light-emitting unit includes a plurality of first and second light-emitting groups. The first and the second light-emitting groups are disposed on the substrate body and electrically connected to the substrate body in series. Each first light-emitting group includes a plurality of first parallel connection units electrically connected in parallel, and each first parallel connection unit includes at least one blue LED chip, and each second light-emitting group includes at least one red LED chip. The package unit includes a phosphor resin body disposed on the substrate body to cover the first and the second light-emitting groups. The frame unit includes a surrounding light-reflecting frame surrounding the first and the second light-emitting groups and the phosphor resin body.

21 Claims, 13 Drawing Sheets

LIGHT-MIXING MULTICHIP PACKAGE STRUCTURE

BACKGROUND OF THE INVENTION

1. Field of the Invention

The instant disclosure relates to a multichip package structure, and more particularly, to a light-mixing multichip package structure.

2. Description of Related Art

The invention of the lamp greatly changed the style of building construction and the living style of human beings, allowing people to work during the night. Traditional lighting devices such as lamps that adopt incandescent bulbs, fluorescent bulbs, or power-saving bulbs have been generally well-developed and used intensively indoor illumination. However, compared to the newly developed light-emitting-diode (LED) lamps, these traditional lamps have the disadvantages of quick attenuation, high power consumption, high heat generation, short working life, high fragility, and being not recyclable. Thus, various LED package structures are created to replace the traditional lighting devices. However, the CRI and the utilization rate of LED chips used in the prior LED package structure are not good enough.

SUMMARY OF THE INVENTION

One aspect of the instant disclosure relates to a light-mixing multichip package structure for increasing the color render index and the utilization rate of LED chips.

One of the embodiments of the instant disclosure provides a light-mixing multichip package structure, comprising: a substrate unit, a light-emitting unit, a package unit, and a frame unit. The substrate unit includes a substrate body. The light-emitting unit includes a plurality of first light-emitting groups and a plurality of second light-emitting groups, wherein the first light-emitting groups and the second light-emitting groups are disposed on the substrate body and electrically connected to the substrate body in series, each first light-emitting group includes a plurality of first parallel connection units electrically connected in parallel, and each first parallel connection unit includes at least one blue LED chip, and each second light-emitting group includes at least one red LED chip. The package unit includes a phosphor resin body disposed on the substrate body to cover the first light-emitting groups and the second light-emitting groups. The frame unit includes a surrounding light-reflecting frame surrounding the first light-emitting groups, the second light-emitting groups, and the phosphor resin body, wherein the phosphor resin body contacts the surrounding light-reflecting frame.

Another one of the embodiments of the instant disclosure provides a light-mixing multichip package structure, comprising: a substrate unit, a light-emitting unit, a package unit, and a frame unit. The substrate unit includes a substrate body. The light-emitting unit includes a plurality of first light-emitting groups and a plurality of second light-emitting groups, wherein the first light-emitting groups and the second light-emitting groups are disposed on the substrate body and electrically connected to the substrate body in series, each first light-emitting group includes at least one blue LED chip, each second light-emitting group includes a plurality of second parallel connection units electrically connected in parallel, and each second parallel connection unit includes at least one red LED chip. The package unit includes a phosphor resin body disposed on the substrate body to cover the first light-emitting groups and the second light-emitting groups. The frame unit includes a surrounding light-reflecting frame surrounding the first light-emitting groups, the second light-emitting groups, and the phosphor resin body, wherein the phosphor resin body contacts the surrounding light-reflecting frame.

Yet another one of the embodiments of the instant disclosure provides a light-mixing multichip package structure, comprising: a substrate unit, a light-emitting unit, a package unit, and a frame unit. The substrate unit includes a substrate body. The light-emitting unit includes a plurality of first light-emitting groups and a plurality of second light-emitting groups, wherein the first light-emitting groups and the second light-emitting groups are disposed on the substrate body and electrically connected to the substrate body in series, wherein each first light-emitting group includes a plurality of first parallel connection units electrically connected in parallel, and each first parallel connection unit includes at least one blue LED chip, wherein each second light-emitting group includes a plurality of second parallel connection units electrically connected in parallel, and each second parallel connection unit includes at least one red LED chip. The package unit includes a phosphor resin body disposed on the substrate body to cover the first light-emitting groups and the second light-emitting groups. The frame unit includes a surrounding light-reflecting frame surrounding the first light-emitting groups, the second light-emitting groups, and the phosphor resin body, wherein the phosphor resin body contacts the surrounding light-reflecting frame.

Therefore, because each first light-emitting group includes a plurality of first parallel connection units electrically connected in parallel and each second light-emitting group includes a plurality of second parallel connection units electrically connected in parallel, the color render index and the utilization rate of the LED chips can be increased.

To further understand the techniques, means and effects of the instant disclosure applied for achieving the prescribed objectives, the following detailed descriptions and appended drawings are hereby referred, such that, through which, the purposes, features and aspects of the instant disclosure can be thoroughly and concretely appreciated. However, the appended drawings are provided solely for reference and illustration, without any intention to limit the instant disclosure.

DETAILED DESCRIPTION OF THE PREFERRED EMBODIMENTS

First Embodiment

Figure 1A:
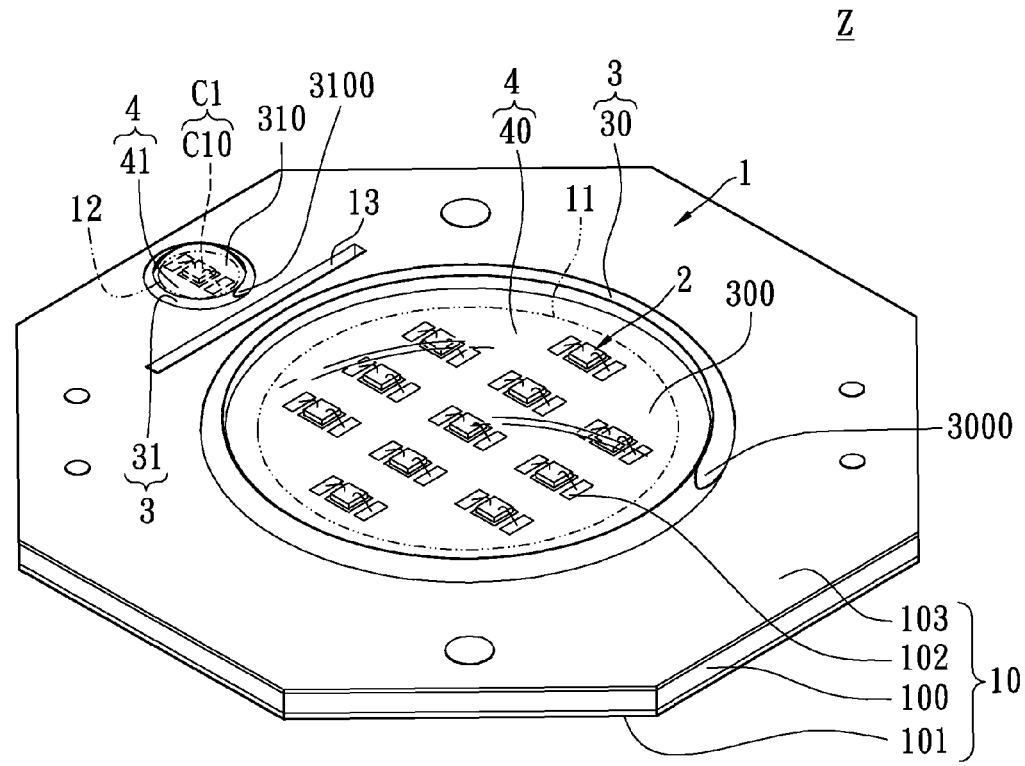
FIG. 1A shows a perspective, schematic view of the light-mixing multichip package structure according to the first embodiment of the instant disclosure.
Figure 1B:
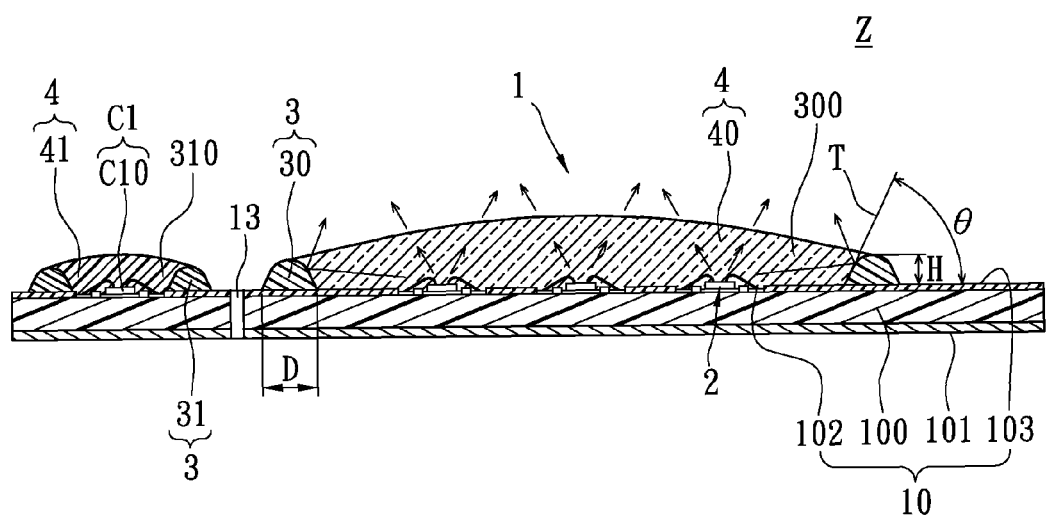
FIG. 1B shows a lateral, cross-sectional, schematic view of the light-mixing multichip package structure according to the first embodiment of the instant disclosure.
Figure 1C:
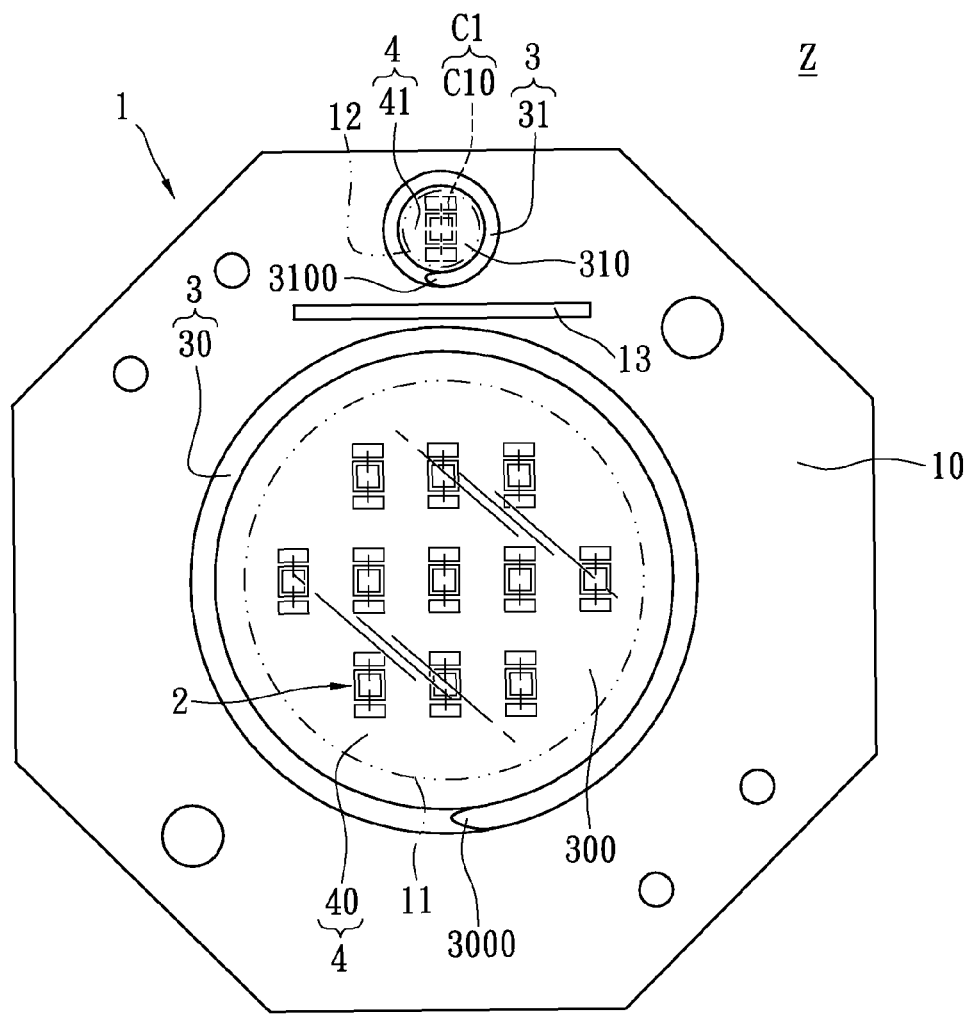
FIG. 1C shows a top, schematic view of the light-mixing multichip package structure according to the first embodiment of the instant disclosure.

Referring to FIG. 1A to FIG. 1E, where the first embodiment of the instant disclosure providing a light-mixing multichip package structure Z, comprising: a substrate unit 1, a light-emitting unit 2, a current-limiting unit C1, a frame unit 3, and a package unit 4.

The substrate unit 1 includes a substrate body 10 having a first chip-mounting area 11 and a second chip-mounting area 12 formed on the top surface of the substrate body 10. For example, the substrate body 10 includes a circuit substrate 100, a heat dissipating layer 101 disposed on the bottom surface of the circuit substrate 100, a plurality of conductive pads 102 disposed on the top surface of the circuit substrate 100, and an insulative layer 103 disposed on the top surface of the circuit substrate 100 to expose the conductive pads 102. Hence, the heat dissipating efficiency of the circuit substrate 100 is increased by using the heat dissipating layer 101, and the insulative layer 103 may be a solder mask for only exposing the conductive pads 102 in order to achieve local soldering.

The light-emitting unit 2 includes a plurality of first light-emitting groups 2A and a plurality of second light-emitting groups 2B. The first light-emitting groups 2A and the second light-emitting groups 2B are disposed on the first chip-mounting area 11 of the substrate body 10 and electrically connected to the substrate body 10 in series. Each first light-emitting group 2A includes a plurality of first parallel connection units 20A electrically connected in parallel, and each first parallel connection unit 20A includes at least one blue LED chip 200A. Each second light-emitting group 2B includes at least one red LED chip 200B. For example, the first light-emitting groups 2A and the second light-emitting groups 2B can be electrically and alternatively connected to the substrate body 10 in series, and the work current of each first light-emitting group 2A may be similar to the work current of each second light-emitting group 2B. When each first parallel connection unit 20A includes a plurality of blue LED chips 200A, each first parallel connection unit 20A has the same number of the blue LED chip 200A.

Figure 1D:
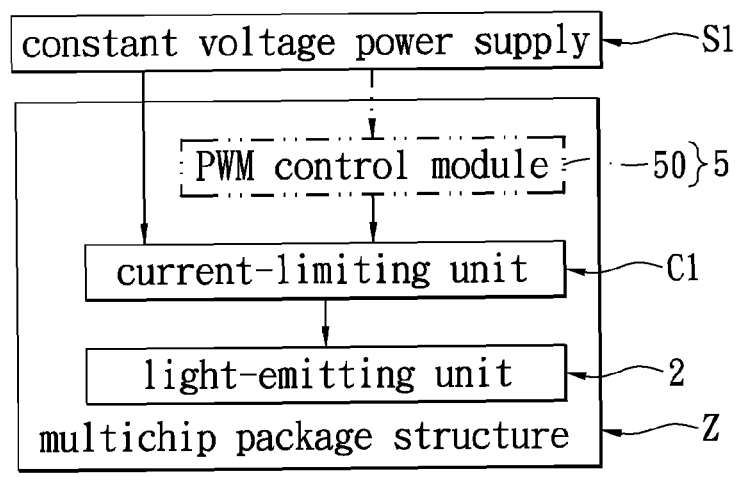
FIG. 1D shows a function block diagram of the light-mixing multichip package structure according to the first embodiment of the instant disclosure.
Figure 1E:
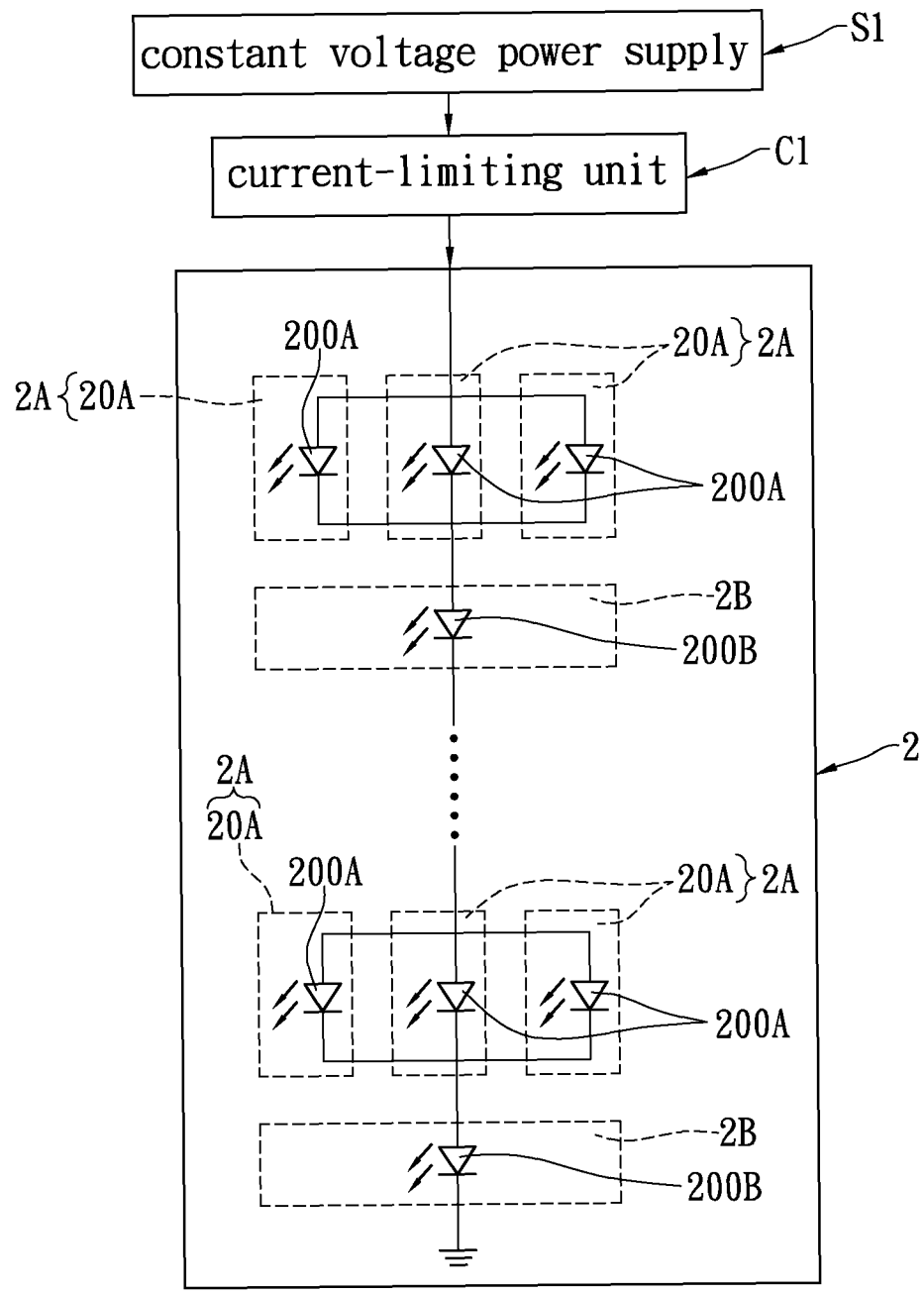
FIG. 1E shows a circuit, schematic diagram of the light-mixing multichip package structure according to the first embodiment of the instant disclosure.

The current-limiting unit C1 includes at least one current-limiting chip C10 electrically connected to and disposed on the second chip-mounting region 12. Of course, the current-limiting unit C1 can also include a plurality of current-limiting chips C10 on the second chip-mounting region 12 for different requirements of amperage or current. The current-limiting chip C10 is electrically connected to the light-emitting unit 2, thus the light-emitting unit 2 can obtain constant voltage through the current-limiting chip C10. For example, the current-limiting chip C10 can be electrically connected to the second chip-mounting region 12 by wire bonding and electrically connected between a constant voltage power source (such as a constant voltage power supply S1) and the light-emitting unit 2 as shown in FIG. 1D. In other words, designer can plan a predetermined second chip-mounting region 12 on the substrate body 10 in advance, thus the current-limiting chip C10 can be placed on the second chip-mounting region 12. In addition, the current-limiting chip C10 is electrically connected between the constant voltage power supply S1 and the light-emitting unit 2, thus the light-emitting unit 2 can obtain constant voltage from the constant voltage power supply S1 through the current-limiting chip C10.

The instant disclosure further comprises a control unit 5 as shown in FIG. 1D. The control unit 5 includes a PWM (Pulse Width Modulation) control module 50 disposed on the substrate body 10 and selectively electrically connected to the current-limiting unit C1, thus the current-limiting unit C1 can be electrically connected between the control unit 5 and the light-emitting unit 2. Of course, the control unit 5 also can be omitted. For example, when the control unit 5 is electrically connected between the constant voltage power supply S1 and the current-limiting unit C1, the PWM control module 50 can control the blue LED chips 200A and the red LED chips 200B to generate a predetermined pulse frequency (such as 50 Hz, 60 Hz, . . . , 120 Hz, etc.).

The frame unit 3 includes a surrounding light-reflecting frame 30 surroundingly formed on the top surface of the substrate body 10 and a surrounding opaque frame 31 surroundingly formed on the top surface of the substrate body 10 by coating. In addition, the surrounding light-reflecting frame 30 surrounds the blue LED chips 200A and the red LED chips 200B to form a first resin position limiting space 300 corresponding to the first chip-mounting region 11, and the surrounding opaque frame 31 surrounds the current-limiting chip C10 to form a second resin position limiting space 310 corresponding to the second chip-mounting region 12. Moreover, the surrounding light-reflecting frame 30 and the surrounding opaque frame 31 can be separated from each other by a predetermined distance. The surrounding light-reflecting frame 30 has a convex or concave junction portion 3000, and the surrounding opaque frame 31 has a convex or concave junction portion 3100. In other words, when the surrounding light-reflecting frame 30 or the surrounding opaque frame 31 is going to finish by surroundingly coating, the convex or concave junction portion (3000 or 3100) is formed naturally on the surrounding light-reflecting frame 30 and the surrounding opaque frame 31.

For example, the method of forming the surrounding light-reflecting frame 30 (or the surrounding opaque frame 31)

includes: surroundingly forming a liquid surrounding colloid (not shown) on the top surface of the substrate body 10 by coating, and then hardening or curing the liquid surrounding colloid to form the surrounding light-reflecting frame 30 (or the surrounding opaque frame 31). In addition, the liquid surrounding colloid can be coated on the substrate body 10 to form any shapes according to different requirements (such as a circular shape, a square or a rectangular shape etc.). The thixotropic index of the liquid surrounding colloid may be between 4 and 6, the pressure of coating the liquid surrounding colloid on the top surface of the substrate body 10 may be between 350 kpa and 450 kpa, and the velocity of coating the liquid surrounding colloid on the top surface of the substrate body 10 may be between 5 mm/s and 15 mm/s. The liquid surrounding colloid is surroundingly coated on the top surface of the substrate body 10 from a start point to a termination point, and the position of the start point and the position of the termination point are substantially the same, thus the surrounding light-reflecting frame 30 has a micro convex portion 5000 close to the start point and the termination point. Furthermore, the liquid surrounding colloid is hardened by baking, the baking temperature may be between 120□ and 140□, and the baking time may be between 20 minute and 40 minute. Therefore, the surrounding light-reflecting frame 30 has an arc shape formed thereon, the surrounding light-reflecting frame 30 has a radius tangent T and the angle θ of the radius tangent T relative to the top surface of the substrate body 10 may be between 40° and 50°, the maximum height H of the surrounding light-reflecting frame 30 relative to the top surface of the substrate body 10 may be between 0.3 mm and 0.7 mm, the width D of the bottom side of the surrounding light-reflecting frame 30 may be between 1.5 mm and 3 mm, the thixotropic index of the surrounding light-reflecting frame 30 may be between 4 and 6, and the surrounding light-reflecting frame 30 is formed by mixing inorganic additive with white thermohardening colloid.

The package unit 4 includes a phosphor resin body 40 filled into the first resin position limiting space 300 to cover the light-emitting unit 2 and an opaque package resin body 41 filled into the second resin position limiting space 310 to cover the current-limiting chip C10. Because the current-limiting chip C10 is covered by the opaque package resin body 41, the second package colloid body 41 can prevent the current-limiting chip C10 from being damaged or affected by lighting. The phosphor resin body 40 and the opaque package resin body 41 are separated from each other by a predetermined distance, and the surrounding light-reflecting frame 30 and the opaque package resin body 41 are separated from each other by a predetermined distance. In other words, the package unit 4 includes a phosphor resin body 40 disposed on the substrate body 10 to cover the first light-emitting groups 2A and the second light-emitting groups 2B. The surrounding light-reflecting frame 30 can surround the first light-emitting groups 2A, the second light-emitting groups 2B, and the phosphor resin body 40, and the phosphor resin body 40 can contact the surrounding light-reflecting frame 30. The current-limiting chip C10 can be covered by the opaque package resin body 41. The current-limiting chip C10 and the opaque package resin body 41 are surrounded by the surrounding opaque frame 31, and the opaque package resin body 41 can contact the surrounding opaque frame 31.

The substrate unit 1 further includes at least one heat-insulating slot 13 passing through the substrate body 10, and the heat-insulating slot 13 is formed between the light-emitting unit 2 and the current-limiting unit C1 or between the surrounding light-reflecting frame 30 and the surrounding opaque frame 31. Hence, the heat-transmitting path between the light-emitting unit 2 and the current-limiting unit C1 can be effectively reduced by using the heat-insulating slot 13, thus the velocity of transmitting the heat generated by the current-limiting chip C10 to the light-emitting unit 2 can be effectively decreased.

Second Embodiment

Figure 2:
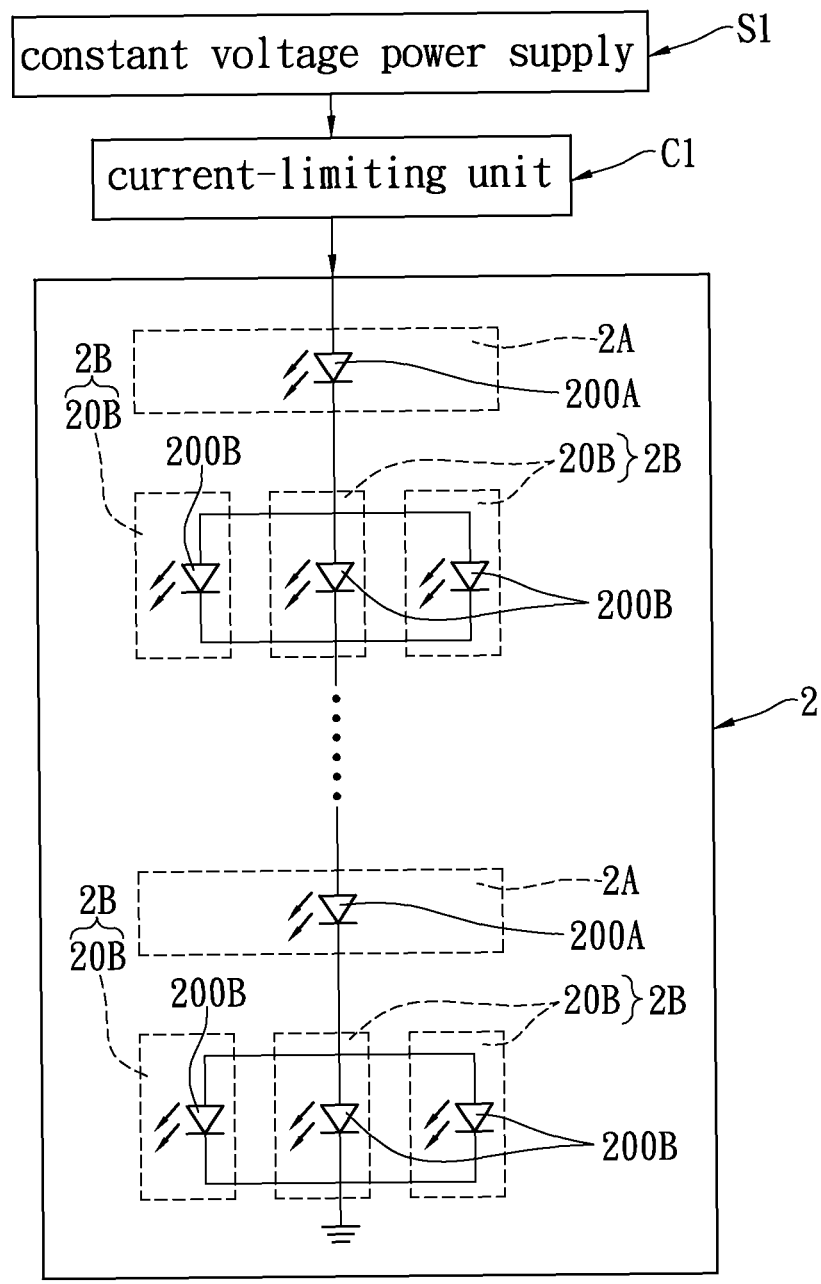
FIG. 2 shows a circuit, schematic diagram of the light-mixing multichip package structure according to the second embodiment of the instant disclosure.

Referring to FIG. 2, where the second embodiment of the instant disclosure providing a light-mixing multichip package structure. Comparing FIG. 2 with FIG. 1E, the difference between the second embodiment and the first embodiment is as follows: in the second embodiment, each first light-emitting group 2A includes at least one blue LED chip 200A, each second light-emitting group 2B includes a plurality of second parallel connection units 20B electrically connected in parallel, and each second parallel connection unit 20B includes at least one red LED chip 200B. For example, the first light-emitting groups 2A and the second light-emitting groups 2B can be electrically and alternatively connected to the substrate body 10 in series, and the work current of each first light-emitting group 2A may be similar to the work current of each second light-emitting group 2B. The each first light-emitting group 2A and each second light-emitting group 2B can be lighted through the work current such as a driving current. When each second parallel connection unit 20B includes a plurality of red LED chips 200B, each second parallel connection unit 20B has the same number of the red LED chip 200B.

Third Embodiment

Figure 3:
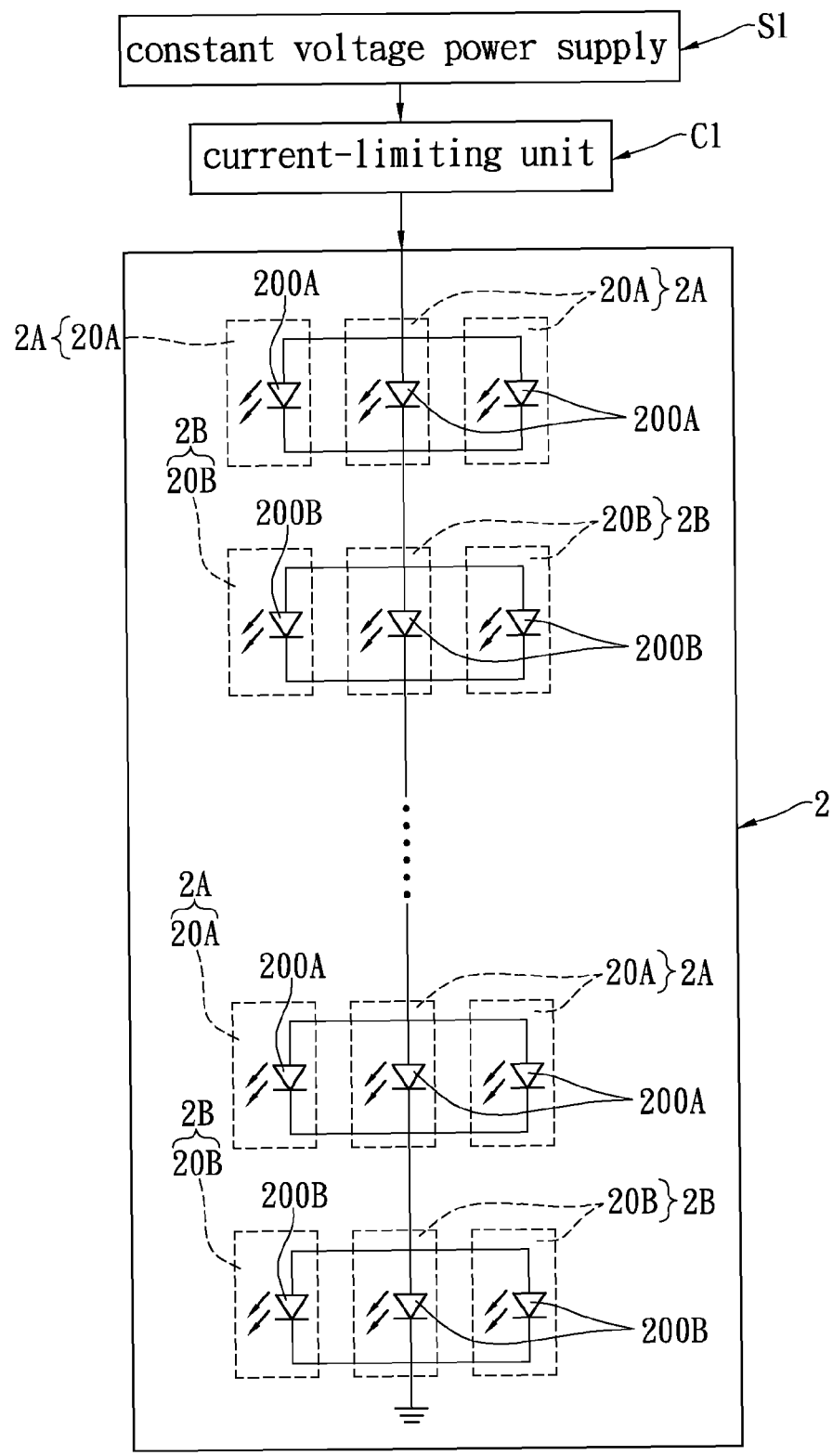
FIG. 3 shows a circuit, schematic diagram of the light-mixing multichip package structure according to the third embodiment of the instant disclosure.
Figure 4A:
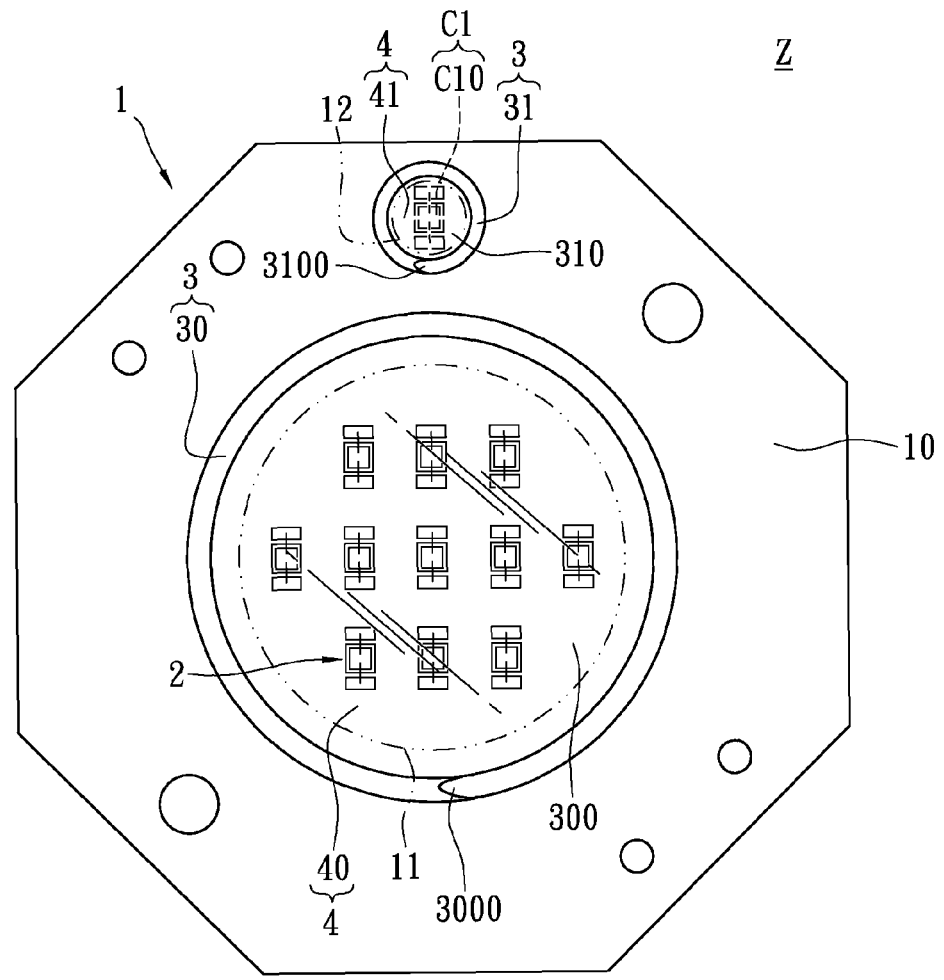
FIG. 4A shows a top, schematic view of the light-mixing multichip package structure according to the fourth embodiment of the instant disclosure.
Figure 4B:
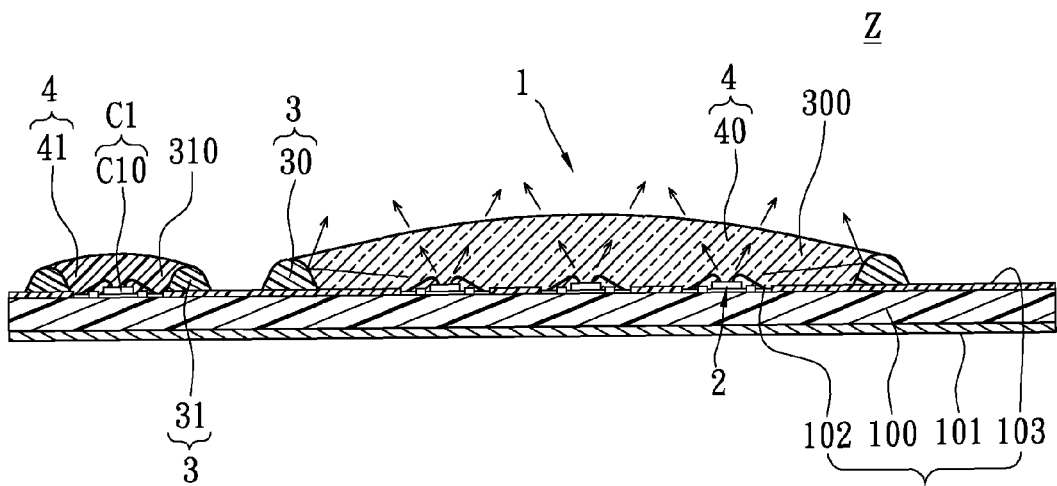
FIG. 4B shows a lateral, cross-sectional, schematic view of the light-mixing multichip package structure according to the fourth embodiment of the instant disclosure.

Referring to FIG. 3, where the third embodiment of the instant disclosure providing a light-mixing multichip package structure. Comparing FIG. 3 with FIG. 1E (or FIG. 2), the difference between the third embodiment and the first (or the second) embodiment is as follows: in the third embodiment, each first light-emitting group 2A includes a plurality of first parallel connection units 20A electrically connected in parallel, and each first parallel connection unit 20A includes at least one blue LED chip 200A. Each second light-emitting group 2B includes a plurality of second parallel connection units 20B electrically connected in parallel, and each second parallel connection unit 20B includes at least one red LED chip 200B. For example, the first light-emitting groups 2A and the second light-emitting groups 2B can be electrically and alternatively connected to the substrate body 10 in series, and the work current of each first light-emitting group 2A may be similar to the work current of each second light-emitting group 2B. When each first parallel connection unit 20A includes a plurality of blue LED chips 200A, each first parallel connection unit 20A has the same number of the blue LED chip 200A. When each second parallel connection unit 20B includes a plurality of red LED chips 200B, each second parallel connection unit 20B has the same number of the red LED chip 200B.

Fifth Embodiment

Figure 5A:
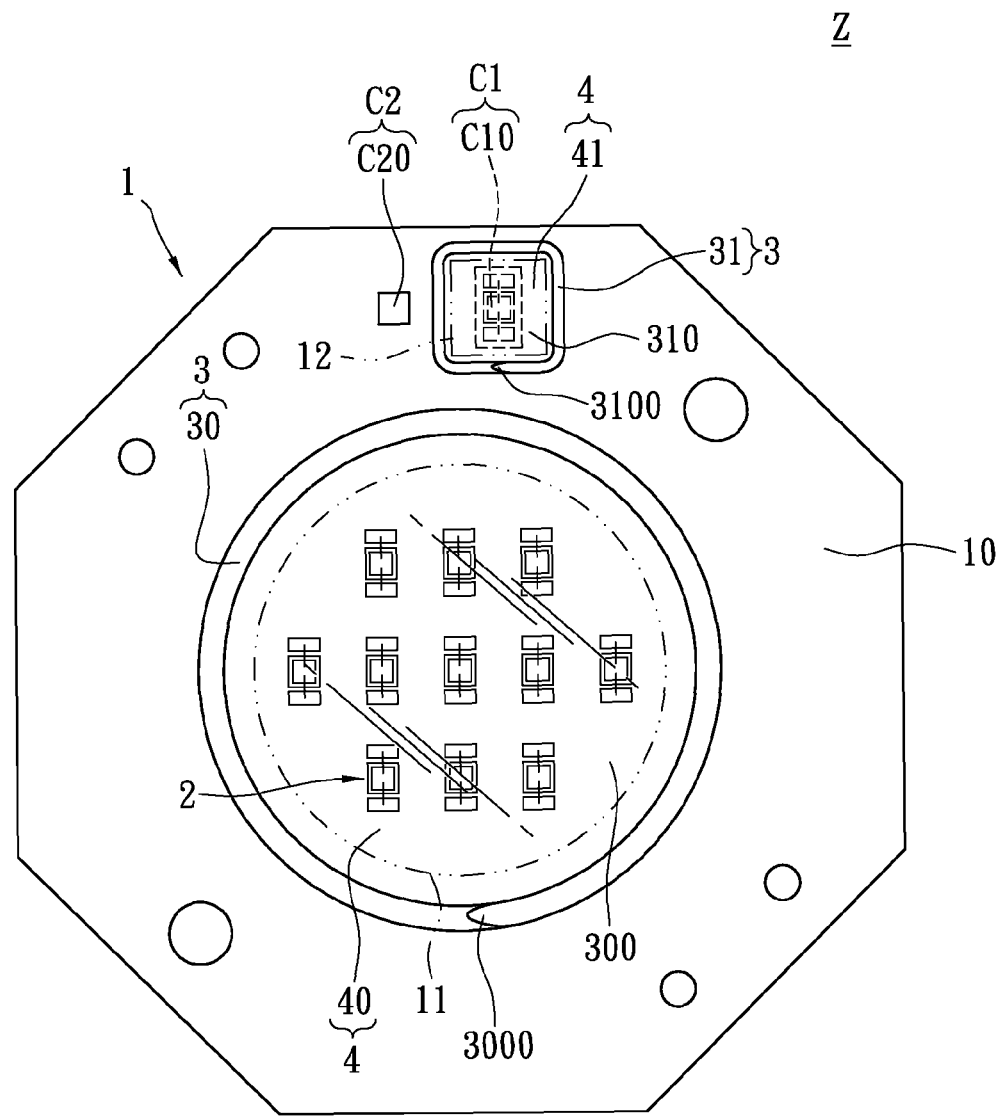
FIG. 5A shows a top, schematic view of the light-mixing multichip package structure according to the fifth embodiment of the instant disclosure.
Figure 5B:
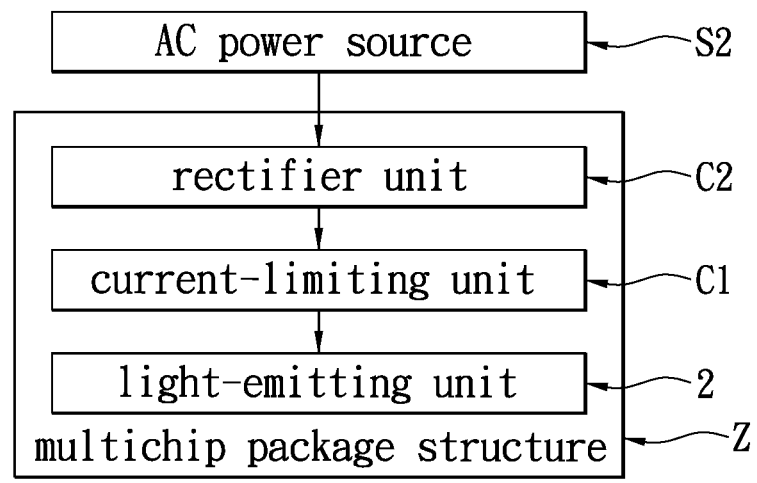
FIG. 5B shows a function block diagram of the light-mixing multichip package structure according to the fifth embodiment of the instant disclosure.

Referring to FIG. 5A and FIG. 5B, where the fifth embodiment of the instant disclosure providing a light-mixing multichip package structure. Comparing FIG. 5A with FIG. 1C and comparing FIG. 5B with 1D, the difference between the fifth embodiment and the first embodiment is as follows: the fifth embodiment further comprises a rectifier unit C2. The rectifier unit C2 includes at least one bridge rectifier C20 exposed and disposed on the substrate body 10. The current-limiting chip C10 is electrically connected between the light-emitting unit 2 and the bridge rectifier C20, the bridge rectifier C20 is electrically connected between the current-limiting chip C10 and an alternating current power source S2. For example, the current-limiting unit C1 and the rectifier unit C2 can be electrically connected between the alternating current power source S2 and the light-emitting unit 2 by wire bonding (as shown in FIG. 5B). Furthermore, AC (Alternating Current) power source S2 can be transformed into DC (Direct Current) power source through the rectifier unit C2, the direct current flow can be control by current-limiting unit C1, thus the light-emitting unit 2 can obtain constant voltage from the DC power source through the rectifier unit C2.

Sixth Embodiment

Figure 5C:
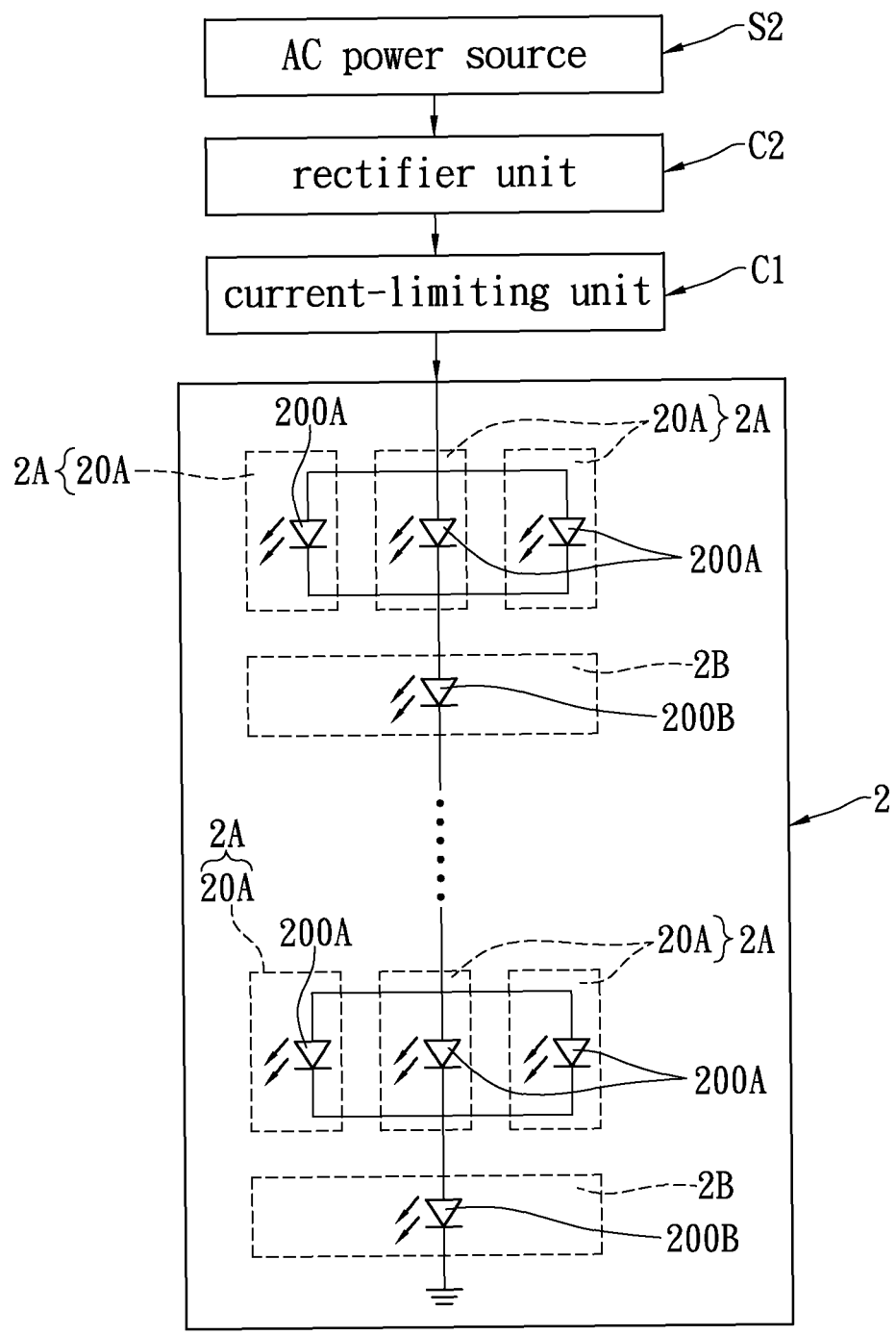
FIG. 5C shows a circuit, schematic diagram of the light-mixing multichip package structure according to the fifth embodiment of the instant disclosure.
Figure 6:
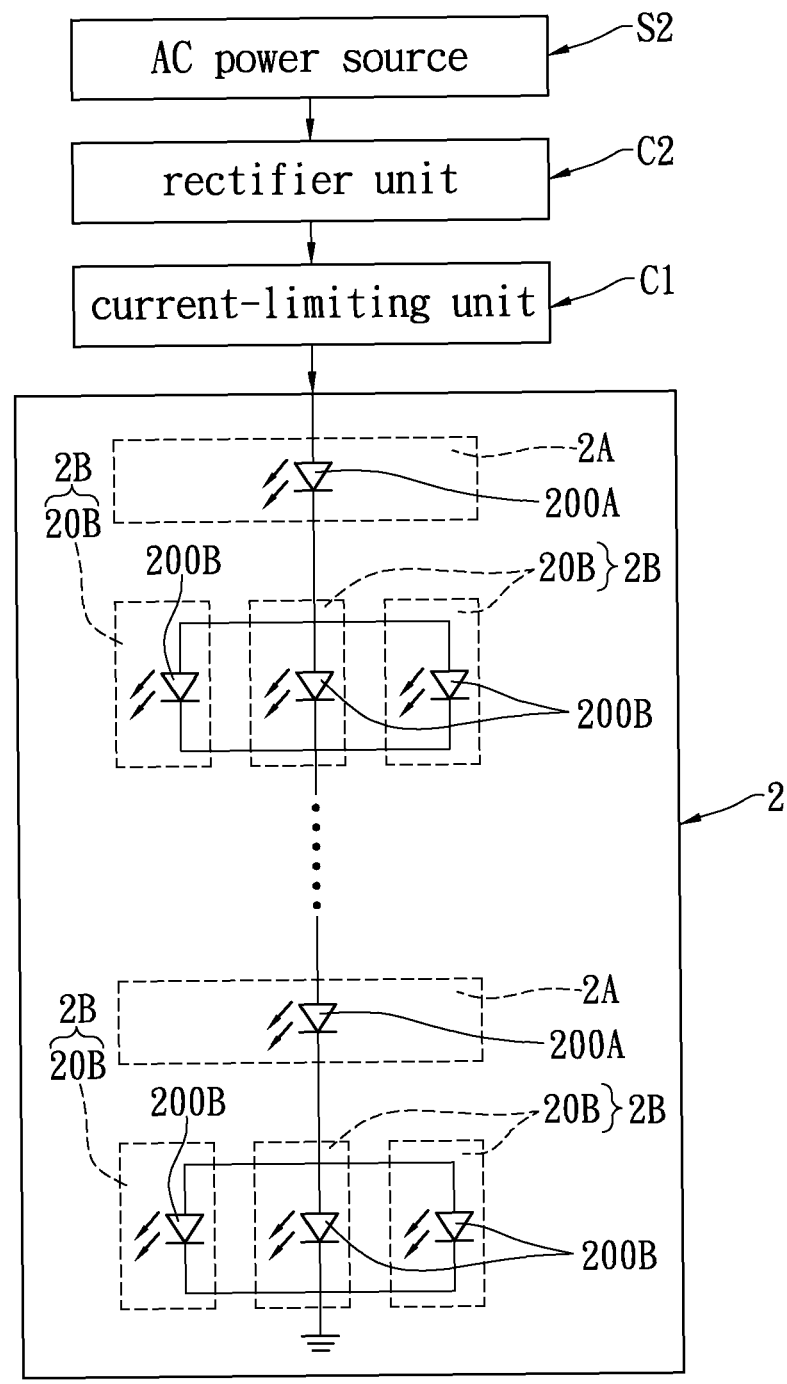
FIG. 6 shows a circuit, schematic diagram of the light-mixing multichip package structure according to the sixth embodiment of the instant disclosure.

Referring to FIG. 6, where the sixth embodiment of the instant disclosure providing a light-mixing multichip package structure. Comparing FIG. 6 with FIG. 5C, the difference between the sixth embodiment and the fifth embodiment is as follows: in the sixth embodiment, each first light-emitting group 2A includes at least one blue LED chip 200A, each second light-emitting group 2B includes a plurality of second parallel connection units 20B electrically connected in parallel, and each second parallel connection unit 20B includes at least one red LED chip 200B. For example, the first light-emitting groups 2A and the second light-emitting groups 2B can be electrically and alternatively connected to the substrate body 10 in series, and the work current of each first light-emitting group 2A may be similar to the work current of each second light-emitting group 2B. The each first light-emitting group 2A and each second light-emitting group 2B can be lighted through the work current such as a driving current. When each second parallel connection unit 20B includes a plurality of red LED chips 200B, each second parallel connection unit 20B has the same number of the red LED chip 200B.

Seventh Embodiment

Figure 7:
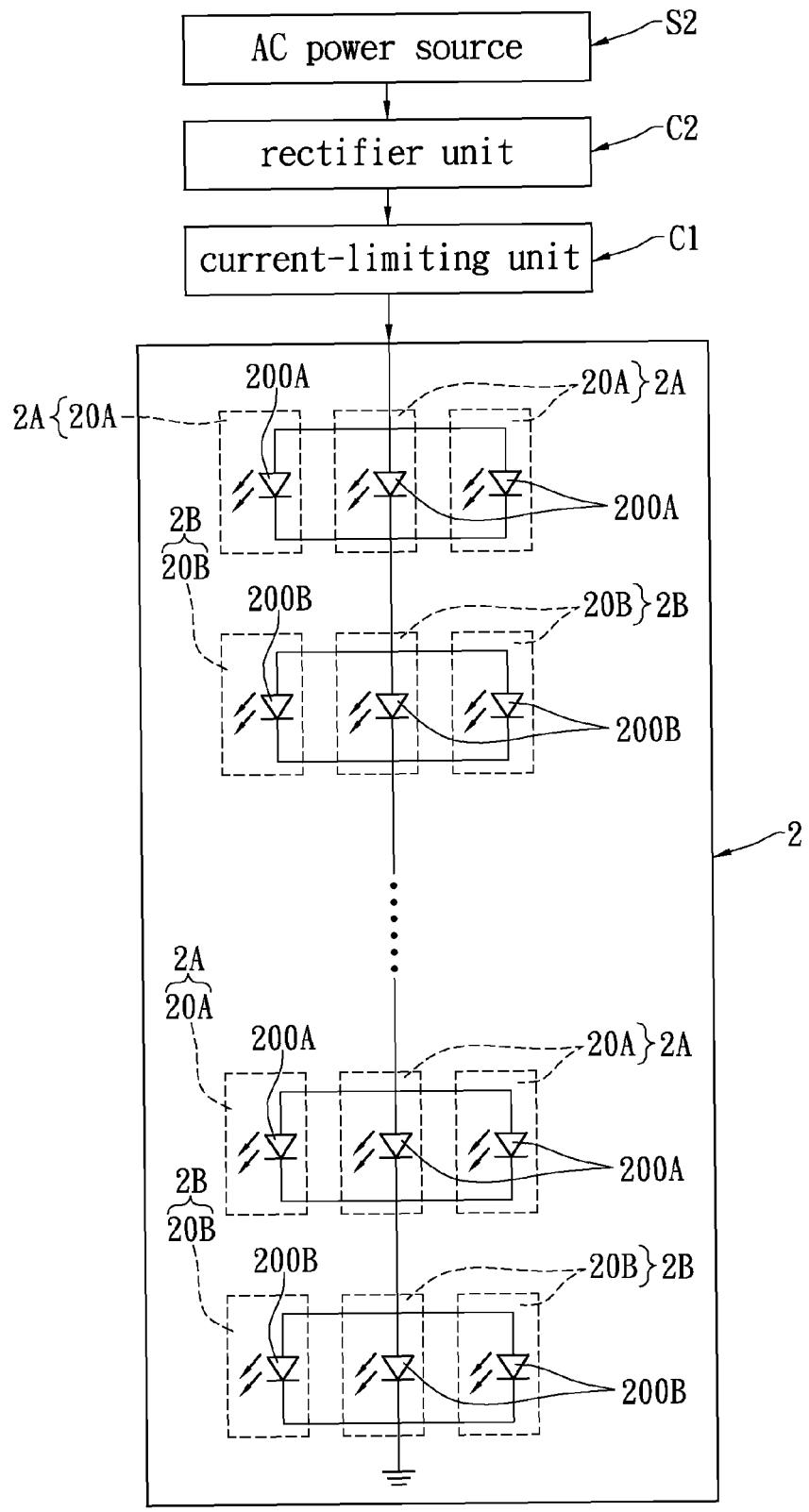
FIG. 7 shows a circuit, schematic diagram of the light-mixing multichip package structure according to the seventh embodiment of the instant disclosure.

Referring to FIG. 7, where the seventh embodiment of the instant disclosure providing a light-mixing multichip package structure. Comparing FIG. 7 with FIG. 5C (or FIG. 6), the difference between the seventh embodiment and the fifth (or the sixth) embodiment is as follows: in the seventh embodiment, each first light-emitting group 2A includes a plurality of first parallel connection units 20A electrically connected in parallel, and each first parallel connection unit 20A includes at least one blue LED chip 200A. Each second light-emitting group 2B includes a plurality of second parallel connection units 20B electrically connected in parallel, and each second parallel connection unit 20B includes at least one red LED chip 200B. For example, the first light-emitting groups 2A and the second light-emitting groups 2B can be electrically and alternatively connected to the substrate body 10 in series, and the work current of each first light-emitting group 2A may be similar to the work current of each second light-emitting group 2B. When each first parallel connection unit 20A includes a plurality of blue LED chips 200A, each first parallel connection unit 20A has the same number of the blue LED chip 200A. When each second parallel connection unit 20B includes a plurality of red LED chips 200B, each second parallel connection unit 20B has the same number of the red LED chip 200B.

Eighth Embodiment

Figure 8:
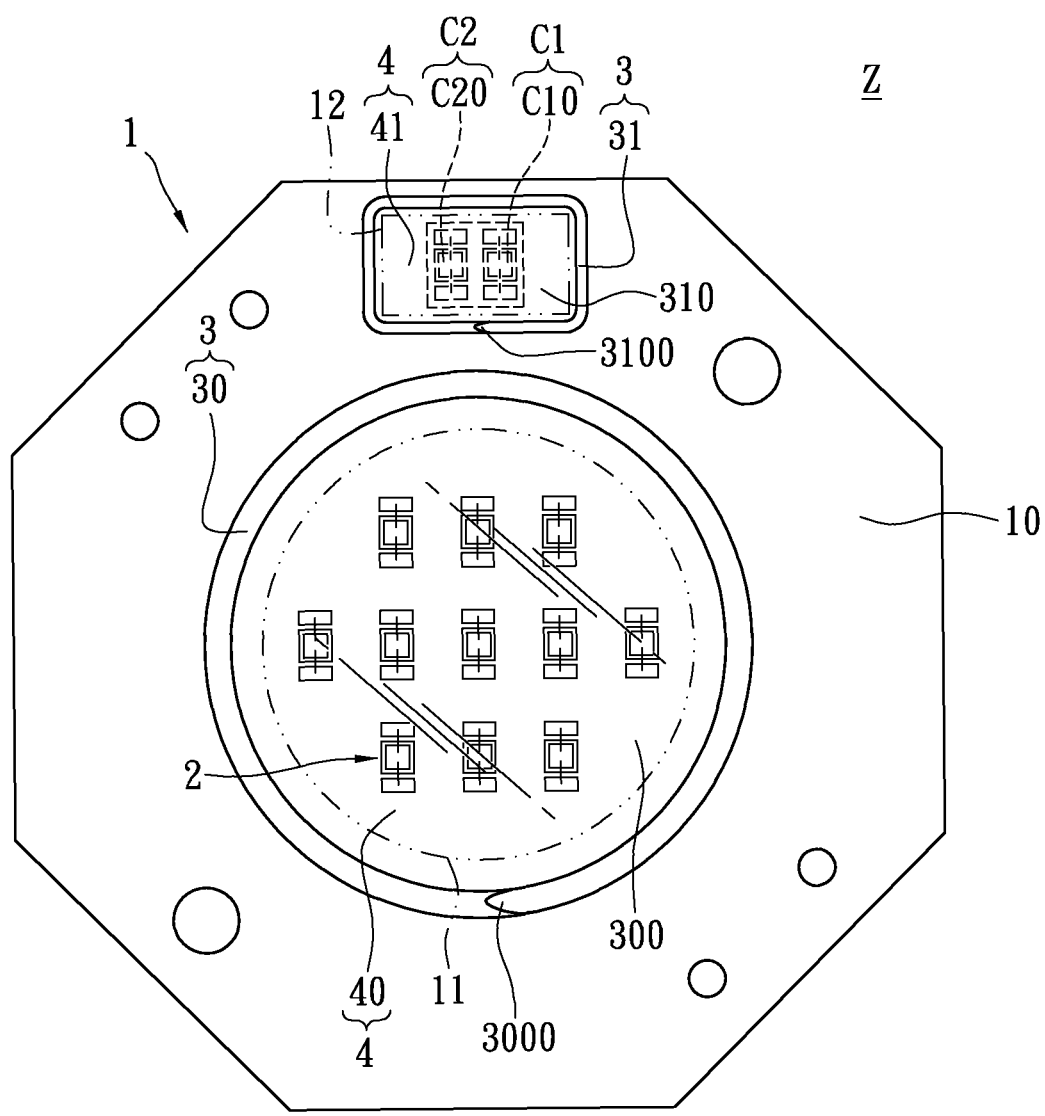
FIG. 8 shows a top, schematic view of the light-mixing multichip package structure according to the eighth embodiment of the instant disclosure.

Referring to FIG. 8, where the eighth embodiment of the instant disclosure providing a light-mixing multichip package structure. Comparing FIG. 8 with FIG. 5A, the difference between the eighth embodiment and the fifth embodiment is as follows: in the eighth embodiment, both the current-limiting chip C10 and the bridge rectifier C20 can be enclosed by the opaque package resin body 41. The current-limiting chip C10, the bridge rectifier C20 and the opaque package resin body 41 are surrounded by the surrounding opaque frame 31, and the opaque package resin body 41 can contact the surrounding opaque frame 31.

Ninth Embodiment

Figure 9:
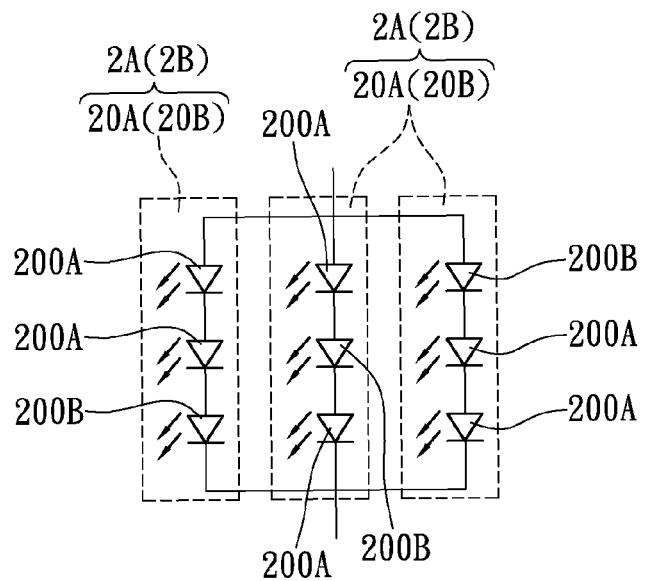
FIG. 9 shows a circuit, schematic diagram of the light-emitting unit of the light-mixing multichip package structure according to the ninth embodiment of the instant disclosure.

Referring to FIG. 9, where the ninth embodiment of the instant disclosure providing a light-mixing multichip package structure. Each first light-emitting group 2A includes a plurality of first parallel connection units 20A electrically connected in parallel, and each first parallel connection unit 20A includes at least one blue LED chip 200A and at least one red LED chip 200B. Each second light-emitting group 2B includes a plurality of second parallel connection units 20B electrically connected in parallel, and each second parallel connection unit 20B includes at least one blue LED chip 200A and at least one red LED chip 200B. For example, the work current of each first light-emitting group 2A may be similar to the work current of each second light-emitting group 2B. When each first parallel connection unit 20A includes a plurality of blue LED chips 200A and a plurality of red LED chips 200B, each first parallel connection unit 20A has the same number of the blue LED chip 200A and the same number of the red LED chip 200B. When each second parallel connection unit 20B includes a plurality of blue LED chips 200A and a plurality of red LED chips 200B, each second parallel connection unit 20B has the same number of the blue LED chip 200A and the same number of the red LED chip 200B.

First to Ninth Embodiments

Figure 10:
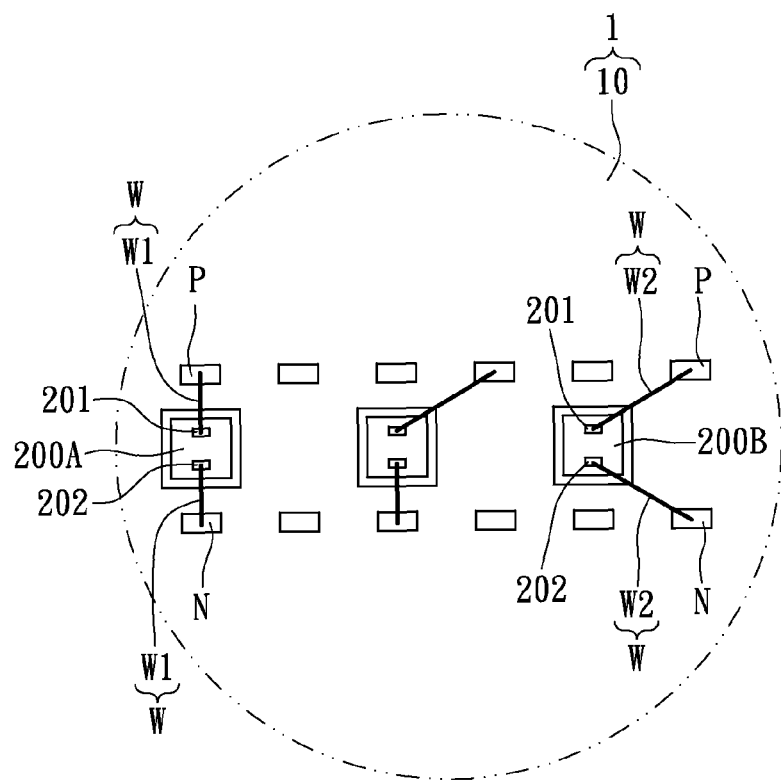
FIG. 10 shows a partial, top, schematic view of using a plurality of standby pads according to the instant disclosure.

Referring to FIG. 10, from the first to the ninth embodiments, the substrate unit 1 includes a plurality of positive pads P disposed on the top surface of the substrate body 10 and a plurality of negative pads N disposed on the top surface of the substrate body 10. Each blue LED chip 200A has a positive electrode 201 and a negative electrode 202, the positive electrode 201 of each blue LED chip 200A corresponds to at least two of the positive pads P, and the negative electrode 202 of each blue LED chip 200A corresponds to at least two of the negative pads N. In addition, each red LED chip 200B has a positive electrode 201 and a negative electrode 202, the positive electrode 201 of each red LED chip 200B corresponds to at least two of the positive pads P, and the negative electrode 202 of each red LED chip 200B corresponds to at least two of the negative pads N.

Moreover, the instant disclosure further comprises a conductive wire unit W including a plurality of first conductive wires W1 and a plurality of second conductive wires W2. The positive electrode 201 of each blue LED chip 200A is electrically connected with one of the two corresponding positive pads P by the first conductive wire W1 (the other corresponding positive pad P is a standby positive pad), and the negative electrode 202 of each blue LED chip 200A is electrically connected with one of the two corresponding negative pads N by the first conductive wire W1 (the other corresponding negative pad N is a standby negative pad). In addition, the positive electrode 201 of each red LED chip 200B is electrically connected with one of the two corresponding positive pads P by the second conductive wire W2, and the negative electrode 202 of each red LED chip 200B is electrically connected with one of the two corresponding negative pads N by the second conductive wire W2.

Therefore, using the blue LED chip 200A as an example, when a first end of the first conductive wire W1 does not correctly connect with first one of the two positive pads P or the two negative pads N (it means that the first end of the first conductive wire W1 does not electrically connect with the first one of the two positive pads P or the two negative pads N (such as floating solder)), the manufacturer can use the same first end of the first conductive wire W1 to connect to another one of the two positive pads P or the two negative pads N without cleaning solder splash on the surface of the first one of the two positive pads P or the two negative pads N, in order to decrease wire-bonding time (increase wire-bonding efficiency) and increase wire-bonding yield.

In conclusion, because each first light-emitting group includes a plurality of first parallel connection units electrically connected in parallel and each second light-emitting group includes a plurality of second parallel connection units electrically connected in parallel, the color render index and the utilization rate of the LED chips can be increased.

The above-mentioned descriptions merely represent the preferred embodiments of the instant disclosure, without any intention or ability to limit the scope of the instant disclosure which is fully described only within the following claims Various equivalent changes, alterations or modifications based on the claims of instant disclosure are all, consequently, viewed as being embraced by the scope of the instant disclosure.

What is claimed is:

1. A light-mixing multichip package structure, comprising:
a substrate unit including a substrate body;
a light-emitting unit including a plurality of first light-emitting groups and a plurality of second light-emitting groups, wherein the first light-emitting groups and the second light-emitting groups are disposed on the substrate body and electrically connected to the substrate body in series, each first light-emitting group includes a plurality of first parallel connection units electrically connected in parallel, and each first parallel connection unit includes at least one blue LED chip, and each second light-emitting group includes at least one red LED chip;
a package unit including a phosphor resin body disposed on the substrate body to cover the first light-emitting groups and the second light-emitting groups; and
a frame unit including a surrounding light-reflecting frame surrounding the first light-emitting groups, the second light-emitting groups, and the phosphor resin body, wherein the phosphor resin body contacts the surrounding light-reflecting frame.

2. The light-mixing multichip package structure of claim 1, wherein the first light-emitting groups and the second light-emitting groups are electrically and alternatively connected to the substrate body in series, each first parallel connection unit has the same number of the blue LED chip, and the work current of each first light-emitting group is similar to the work current of each second light-emitting group.

3. The light-mixing multichip package structure of claim 1, wherein the surrounding light-reflecting frame has a convex junction portion or a concave junction portion, the surrounding light-reflecting frame has an arc shape formed thereon, the surrounding light-reflecting frame has a radius tangent and the angle of the radius tangent relative to the top surface of the substrate body is between 40° and 50°, the maximum height of the surrounding light-reflecting frame relative to the top surface of the substrate body is between 0.3 mm and 0.7 mm, the width of the bottom side of the surrounding light-reflecting frame is between 1.5 mm and 3 mm, the thixotropic index of the surrounding light-reflecting frame is between 4 and 6, and the surrounding light-reflecting frame is formed by mixing inorganic additive with white thermohardening colloid.

4. The light-mixing multichip package structure of claim 1, wherein the substrate unit includes a plurality of positive pads disposed on the top surface of the substrate body and a plurality of negative pads disposed on the top surface of the substrate body, wherein each blue LED chip has a positive electrode and a negative electrode, the positive electrode of each blue LED chip corresponds to at least two of the positive pads, and the negative electrode of each blue LED chip corresponds to at least two of the negative pads, wherein each red LED chip has a positive electrode and a negative electrode, the positive electrode of each red LED chip corresponds to at least two of the positive pads, and the negative electrode of each red LED chip corresponds to at least two of the negative pads.

5. The light-mixing multichip package structure of claim 4, further comprising: a conductive wire unit including a plurality of first conductive wires and a plurality of second conductive wires, wherein the positive electrode of each blue LED chip is electrically connected with one of the two corresponding positive pads by the second conductive wire, and the negative electrode of each blue LED chip is electrically connected with one of the two corresponding negative pads by the second conductive wire, wherein the positive electrode of each red LED chip is electrically connected with one of the two corresponding positive pads by the first conductive wire, and the negative electrode of each red LED chip is electrically connected with one of the two corresponding negative pads by the first conductive wire.

6. The light-mixing multichip package structure of claim 1, further comprising: a current-limiting unit including at least one current-limiting chip disposed on the substrate body and electrically connected between the light-emitting unit and a constant voltage power source, wherein the at least one current-limiting chip is covered by an opaque package resin body, and the at least one current-limiting chip and the opaque package resin body are surrounded by a surrounding opaque frame.

7. The light-mixing multichip package structure of claim 1, further comprising: a current-limiting unit and a rectifier unit, wherein the current-limiting unit includes at least one current-limiting chip disposed on the substrate body, the rectifier unit includes at least one bridge rectifier disposed on the substrate body, the at least one current-limiting chip is electrically connected between the light-emitting unit and the at least one bridge rectifier, the at least one bridge rectifier is electrically connected between the at least one current-limiting chip and an alternating current power source, the at least one current-limiting chip is covered by an opaque package resin body, and the at least one current-limiting chip and the opaque package resin body are surrounded by a surrounding opaque frame.

8. A light-mixing multichip package structure, comprising:
a substrate unit including a substrate body;
a light-emitting unit including a plurality of first light-emitting groups and a plurality of second light-emitting groups, wherein the first light-emitting groups and the second light-emitting groups are disposed on the substrate body and electrically connected to the substrate body in series, each first light-emitting group includes at least one blue LED chip, each second light-emitting group includes a plurality of second parallel connection units electrically connected in parallel, and each second parallel connection unit includes at least one red LED chip;

a package unit including a phosphor resin body disposed on the substrate body to cover the first light-emitting groups and the second light-emitting groups; and a frame unit including a surrounding light-reflecting frame surrounding the first light-emitting groups, the second light-emitting groups, and the phosphor resin body, wherein the phosphor resin body contacts the surrounding light-reflecting frame.

9. The light-mixing multichip package structure of claim 8, wherein the first light-emitting groups and the second light-emitting groups are electrically and alternatively connected to the substrate body in series, each second parallel connection unit has the same number of the red LED chip, and the work current of each first light-emitting group is similar to the work current of each second light-emitting group.

10. The light-mixing multichip package structure of claim 8, wherein the surrounding light-reflecting frame has a convex junction portion or a concave junction portion, the surrounding light-reflecting frame has an arc shape formed thereon, the surrounding light-reflecting frame has a radius tangent and the angle of the radius tangent relative to the top surface of the substrate body is between 40° and 50°, the maximum height of the surrounding light-reflecting frame relative to the top surface of the substrate body is between 0.3 mm and 0.7 mm, the width of the bottom side of the surrounding light-reflecting frame is between 1.5 mm and 3 mm, the thixotropic index of the surrounding light-reflecting frame is between 4 and 6, and the surrounding light-reflecting frame is formed by mixing inorganic additive with white thermohardening colloid.

11. The light-mixing multichip package structure of claim 8, wherein the substrate unit includes a plurality of positive pads disposed on the top surface of the substrate body and a plurality of negative pads disposed on the top surface of the substrate body, wherein each blue LED chip has a positive electrode and a negative electrode, the positive electrode of each blue LED chip corresponds to at least two of the positive pads, and the negative electrode of each blue LED chip corresponds to at least two of the negative pads, wherein each red LED chip has a positive electrode and a negative electrode, the positive electrode of each red LED chip corresponds to at least two of the positive pads, and the negative electrode of each red LED chip corresponds to at least two of the negative pads.

12. The light-mixing multichip package structure of claim 11, further comprising: a conductive wire unit including a plurality of first conductive wires and a plurality of second conductive wires, wherein the positive electrode of each blue LED chip is electrically connected with one of the two corresponding positive pads by the second conductive wire, and the negative electrode of each blue LED chip is electrically connected with one of the two corresponding negative pads by the second conductive wire, wherein the positive electrode of each red LED chip is electrically connected with one of the two corresponding positive pads by the first conductive wire, and the negative electrode of each red LED chip is electrically connected with one of the two corresponding negative pads by the first conductive wire.

13. The light-mixing multichip package structure of claim 8, further comprising: a current-limiting unit including at least one current-limiting chip disposed on the substrate body and electrically connected between the light-emitting unit and a constant voltage power source, wherein the at least one current-limiting chip is covered by an opaque package resin body, and the at least one current-limiting chip and the opaque package resin body are surrounded by a surrounding opaque frame.

14. The light-mixing multichip package structure of claim 8, further comprising: a current-limiting unit and a rectifier unit, wherein the current-limiting unit includes at least one current-limiting chip disposed on the substrate body, the rectifier unit includes at least one bridge rectifier disposed on the substrate body, the at least one current-limiting chip is electrically connected between the light-emitting unit and the at least one bridge rectifier, the at least one bridge rectifier is electrically connected between the at least one current-limiting chip and an alternating current power source, the at least one current-limiting chip is covered by an opaque package resin body, and the at least one current-limiting chip and the opaque package resin body are surrounded by a surrounding opaque frame.

15. A light-mixing multichip package structure, comprising:
a substrate unit including a substrate body;
a light-emitting unit including a plurality of first light-emitting groups and a plurality of second light-emitting groups, wherein the first light-emitting groups and the second light-emitting groups are disposed on the substrate body and electrically connected to the substrate body in series, wherein each first light-emitting group includes a plurality of first parallel connection units electrically connected in parallel, and each first parallel connection unit includes at least one blue LED chip, wherein each second light-emitting group includes a plurality of second parallel connection units electrically connected in parallel, and each second parallel connection unit includes at least one red LED chip;
a package unit including a phosphor resin body disposed on the substrate body to cover the first light-emitting groups and the second light-emitting groups; and
a frame unit including a surrounding light-reflecting frame surrounding the first light-emitting groups, the second light-emitting groups, and the phosphor resin body, wherein the phosphor resin body contacts the surrounding light-reflecting frame.

16. The light-mixing multichip package structure of claim 15, wherein the first light-emitting groups and the second light-emitting groups are electrically and alternatively connected to the substrate body in series, each first parallel connection unit has the same number of the blue LED chip, each second parallel connection unit has the same number of the red LED chip, and the work current of each first light-emitting group is similar to the work current of each second light-emitting group.

17. The light-mixing multichip package structure of claim 15, wherein the surrounding light-reflecting frame has a convex junction portion or a concave junction portion, the surrounding light-reflecting frame has an arc shape formed thereon, the surrounding light-reflecting frame has a radius tangent and the angle of the radius tangent relative to the top surface of the substrate body is between 40° and 50°, the maximum height of the surrounding light-reflecting frame relative to the top surface of the substrate body is between 0.3 mm and 0.7 mm, the width of the bottom side of the surrounding light-reflecting frame is between 1.5 mm and 3 mm, the thixotropic index of the surrounding light-reflecting frame is between 4 and 6, and the surrounding light-reflecting frame is formed by mixing inorganic additive with white thermohardening colloid.

18. The light-mixing multichip package structure of claim 15, wherein the substrate unit includes a plurality of positive pads disposed on the top surface of the substrate body and a plurality of negative pads disposed on the top surface of the substrate body, wherein each blue LED chip has a positive electrode and a negative electrode, the positive electrode of each blue LED chip corresponds to at least two of the positive pads, and the negative electrode of each blue LED chip corresponds to at least two of the negative pads, wherein each red LED chip has a positive electrode and a negative electrode, the positive electrode of each red LED chip corresponds to at least two of the positive pads, and the negative electrode of each red LED chip corresponds to at least two of the negative pads.

19. The light-mixing multichip package structure of claim 18, further comprising: a conductive wire unit including a plurality of first conductive wires and a plurality of second conductive wires, wherein the positive electrode of each blue LED chip is electrically connected with one of the two corresponding positive pads by the second conductive wire, and the negative electrode of each blue LED chip is electrically connected with one of the two corresponding negative pads by the second conductive wire, wherein the positive electrode of each red LED chip is electrically connected with one of the two corresponding positive pads by the first conductive wire, and the negative electrode of each red LED chip is electrically connected with one of the two corresponding negative pads by the first conductive wire.

20. The light-mixing multichip package structure of claim 15, further comprising: a current-limiting unit including at least one current-limiting chip disposed on the substrate body and electrically connected between the light-emitting unit and a constant voltage power source, wherein the at least one current-limiting chip is covered by an opaque package resin body, and the at least one current-limiting chip and the opaque package resin body are surrounded by a surrounding opaque frame.

21. The light-mixing multichip package structure of claim 15, further comprising: a current-limiting unit and a rectifier unit, wherein the current-limiting unit includes at least one current-limiting chip disposed on the substrate body, the rectifier unit includes at least one bridge rectifier disposed on the substrate body, the at least one current-limiting chip is electrically connected between the light-emitting unit and the at least one bridge rectifier, the at least one bridge rectifier is electrically connected between the at least one current-limiting chip and an alternating current power source, the at least one current-limiting chip is covered by an opaque package resin body, and the at least one current-limiting chip and the opaque package resin body are surrounded by a surrounding opaque frame.

* * * * *